(12) United States Patent
Matsuzuka et al.

(10) Patent No.: US 7,936,219 B2
(45) Date of Patent: May 3, 2011

(54) POWER AMPLIFIER BIAS CIRCUIT

(75) Inventors: Takayuki Matsuzuka, Tokyo (JP);
Kazuya Yamamoto, Tokyo (JP);
Atsushi Okamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/712,234

(22) Filed: Feb. 25, 2010

(65) Prior Publication Data
US 2011/0018639 A1 Jan. 27, 2011

(30) Foreign Application Priority Data

Jul. 27, 2009 (JP) ................................. 2009-174475

(51) Int. Cl.
*H03F 3/04* (2006.01)
(52) U.S. Cl. ........................................ 330/296; 330/285
(58) Field of Classification Search .................. 330/296, 330/285
See application file for complete search history.

(56) References Cited

U.S. PATENT DOCUMENTS

| 6,946,913 | B2 | | 9/2005 | Moriwaki et al. |
| 7,012,469 | B2 | * | 3/2006 | Moriwaki et al. ............ 330/285 |
| 7,123,095 | B2 | * | 10/2006 | Tsutsui et al. ................ 330/285 |
| 7,332,966 | B2 | | 2/2008 | Furuya et al. |
| 7,400,202 | B2 | | 7/2008 | Yamamoto et al. |
| 7,417,507 | B2 | * | 8/2008 | Yamamoto et al. |
| 7,439,808 | B2 | * | 10/2008 | Inamori et al. ................ 330/289 |
| 7,522,001 | B2 | | 4/2009 | Yamamoto et al. |
| 7,579,914 | B2 | * | 8/2009 | Amano ......................... 330/296 |
| 7,602,238 | B2 | * | 10/2009 | Matsuzuka et al. ............ 330/51 |

FOREIGN PATENT DOCUMENTS

| JP | 2004-343244 A | 2/2004 |
| JP | 2004-274433 A | 9/2004 |
| JP | 2005-217557 A | 8/2005 |
| JP | 2006-270146 A | 10/2006 |
| JP | 2007-134768 A | 5/2007 |
| JP | 2007-318463 A | 12/2007 |
| JP | 2009-55096 A | 3/2009 |

* cited by examiner

*Primary Examiner* — Patricia Nguyen
(74) *Attorney, Agent, or Firm* — Leydig, Voit & Mayer, Ltd.

(57) ABSTRACT

A power amplifier and bias circuit includes a combination circuit in which a voltage drive bias circuit and a current drive bias circuit are connected in a parallel relationship with each other. The power amplifier bias circuit also includes an idle current control circuit which uses the collector voltage of amplifier transistors. When the collector voltage of the amplifier transistors is lower than the threshold voltage of a first transistor (approximately 1.3 V), the first transistor is turned off. At that time, since the reference voltage (2.4-2.5 V) is higher than the voltage for turning on both a second transistor and a diode (namely, approximately 1.3 V plus 0.7 V), a current flows and the first transistor turns on. As a result, a current is drawn from the bases of the amplifier transistors to GND through two resistances, so that the idle currents of the amplifier transistors decrease.

15 Claims, 14 Drawing Sheets

POWER AMPLIFIER BIAS CIRCUIT

FIELD OF THE INVENTION

The present invention relates to a power amplifier bias circuit, and more particularly to a power amplifier bias circuit for use in power amplifiers for mobile communications such as cellular phones.

BACKGROUND ART

GaAs-HBT (Heterojunction Bipolar Transistor) power amplifiers are currently widely used as cellular phone power amplifiers for CDMA (Code Division Multiple Access), etc. FIG. 25, which includes FIGS. 25A and 25B, shows an exemplary circuit of a GaAs-HBT power amplifier module. In FIG. 25A, the GaAs chip is represented by broken lines; the other circuit elements include chip components and transmission lines formed on the module substrate.

Referring to the figure, symbol IN denotes an RF signal input terminal; OUT, an RF signal output terminal; Vc1, the collector power terminal for the first stage transistor; Vc2, the collector power terminal for the last stage transistor; Vcb, the power terminal for the bias circuits for the first and last stage transistors; and Vref, the input voltage terminal for the bias circuits. Further, symbols Tr1 and Tr2 denote heterojunction bipolar transistors; Rb1, Rb2, Rb12, and Rb22, resistances; C1 to C4, C21 to C23, Cd1, Cd2, and Cdb, capacitances; L1 and L2, inductors; and L11 and L21 to L23, transmission lines having a predetermined electrical length and acting as inductors.

FIG. 25B shows the transistor Tr2 and an exemplary detailed circuit configuration of its bias circuit. It should be noted that the transistor Tr1 and its bias circuit are similar, circuit-wise, to Tr2 and its bias circuit. In FIG. 25B, symbols Trb1 to Trb5 denote HBTs; Rbb1 to Rbb6, resistances; Vrefb, the input voltage terminal for the bias circuit (i.e., a terminal for receiving an external reference voltage); Vcb, the collector power terminal for the bias circuit; and Vbo, the output terminal of the bias circuit. This bias circuit operates in such a manner that the idle current of Tr1 or Tr2 (i.e., the bias current at no RF signal input) in the power amplifier is maintained constant over temperature variation. A more detailed description of the operation is disclosed in Japanese Laid-Open Patent Publication No. 2004-343244.

In order to enable the bias circuit of the power amplifier shown in FIG. 25 to operate properly, a reference voltage Vref higher than twice the barrier voltage of the HBTs must be applied to the circuit, since it includes the series connection of the diode-connected stacked transistors Trb4 and Trb5 and the series connection of the last stage transistor Tr2 and the transistor Trb1 in a stacked configuration. That is, in the case where GaAs-based HBTs are used, the reference voltage Vref must be in the range of approximately 2.7 to 2.9 V since the barrier voltage is in the range of approximately 1.25 to 1.30 V and the voltage drop across the resistance Rbb1 is in the range of approximately 0.2 to 0.3 V.

When Vref is reduced to lower than twice the barrier voltage of the HBTs, for example, to 2.5 V, no idle current flows even at normal temperature, that is, the bias circuit shown in FIG. 25 can no longer be practically used. This problem becomes more acute with decrease in temperature, since the barrier voltage, which is determined by the device material, increases as the temperature decreases. Generally, this barrier voltage has a temperature coefficient of approximately −1 to −2 mV/° C.

FIG. 26 shows a bias circuit capable of low voltage operation (namely, operable even when Vref is in the range of 2.4 to 2.5 V) which has been devised to solve the above problem. In this figure, symbols Tr2a and Tr2b denote power transistors; Trb1 to Trb6, bias transistors; Rbb1 to Rbb13, resistances; and C4, Ca, and Cd2, capacitances.

The power transistor Tr2a is driven by two currents supplied through different paths: a first current being directly injected through the resistance Rbb9 (current drive); and a second current being supplied through the emitter follower formed by Trb1 and Trb2 (voltage drive). On the other hand, Tr2b is driven only by the current injected through a path including the resistance Rbb13 (current drive). The use of the bias circuit shown in FIG. 26 allows for power amplification operation at low values of Vref (namely, 2.4-2.5 V). More detailed descriptions of the circuit operation are disclosed in Japanese Laid-Open Patent Publication Nos. 2007-134768 and 2007-318463.

Other related art includes Japanese Laid-Open Patent Publication Nos. 2004-274433, 2006-270146, 2005-217557, and 2009-55096.

Cellular phones are operated primarily at a low or medium output when used in urban areas where base stations are relatively densely located. That is, it is important to improve the efficiency of the low and medium output operation of cellular phones in order to increase the maximum allowable talk time. Recently, it is becoming more and more important to increase the operating efficiency of cellular phones at low and medium output (no more than approximately 18 dBm), as well as at high output (approximately 27 dBm).

One way to improve the efficiency of the low and medium output operation of a cellular phone is to decrease the collector voltage Vc of the amplifier transistor as the output power decreases. In order to sufficiently improve the distortion characteristics of a cellular phone operating at a medium or low output, it is desirable to optimally adjust the idle current of each stage amplifier transistor in accordance with the output power, as described in, e.g., paragraph [0007] of Japanese Laid-Open Patent Publication No. 2009-55096. Therefore, it is desired that the bias circuit be capable of controlling the idle current in accordance with the collector voltage Vc of the amplifier transistor. The present inventor has intensively studied this problem, and found it difficult to enable a GaAs-HBT power amplifier to exhibit satisfactory distortion characteristics during its low or medium output operation if the collector voltage of the amplifier transistors is reduced with the idle current maintained at the same level.

SUMMARY OF THE INVENTION

The present invention has been made to solve the above problems. It is, therefore, an object of the present invention to provide a power amplifier bias circuit capable of adjusting the idle current of the amplifier transistor in accordance with its collector voltage so that the power amplifier exhibits low distortion characteristics.

According to one aspect of the present invention, a power amplifier bias circuit includes:

a voltage drive bias circuit connected to the base of a first amplifier transistor;

a current drive bias circuit connected in a parallel relationship with the voltage drive bias circuit and also connected to the base of the first amplifier transistor; and an idle current control circuit for controlling the bias current input to the base of the first amplifier transistor in accordance with the collector voltage of the first amplifier transistor.

The voltage drive bias circuit and the current drive bias circuit are connected to a reference voltage input terminal to which a reference voltage is externally applied.

The voltage drive bias circuit includes:

a first transistor for supplying a bias current corresponding to the reference voltage to the base of the first amplifier transistor;

a second transistor having a collector connected between the emitter of the first transistor and the base of the first amplifier transistor through a first resistance and having a grounded emitter; and a third transistor having a base connected to the reference voltage input terminal through a second resistance and supplying a bias current corresponding to the reference voltage to the base of the second transistor.

The current drive bias circuit includes a third resistance connected at one end to the reference voltage input terminal and at the other end to the base of the first amplifier transistor.

The idle current control circuit includes a first control section transistor having a collector connected between the base of the first amplifier transistor and the parallel circuitry including the voltage drive bias circuit and the current drive bias circuit, the first control section transistor having a base for receiving a current corresponding to the collector voltage of the first amplifier transistor.

According to the present invention, the idle current control circuit can adjust the idle current of the amplifier transistor in accordance with its collector voltage. Therefore, when the collector voltage of the amplifier transistor is reduced during low or medium output operation, the idle current of the transistor can be adjusted to an appropriate value with respect to the output power. Thus, the present invention enables the idle current of the amplifier transistor to be adjusted in accordance with the collector voltage so that the power amplifier exhibits low distortion characteristics.

Other and further objects, features and advantages of the invention will appear more fully from the following description.

DETAILED DESCRIPTION OF THE PREFERRED EMBODIMENTS

First Embodiment

Figure 1:
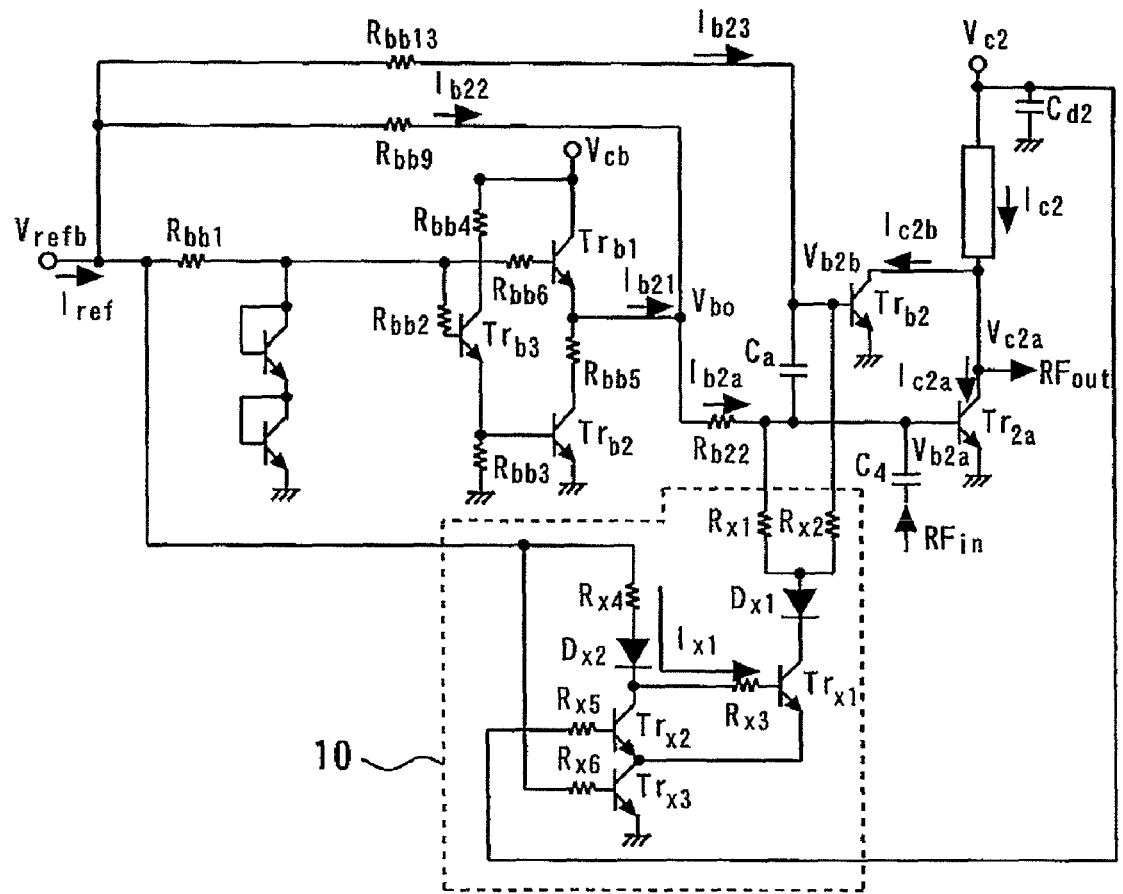
FIG. 1 is a circuit diagram showing a bias circuit for a GaAs-HBT power amplifier according to a first embodiment of the present invention.
Figure 25A:
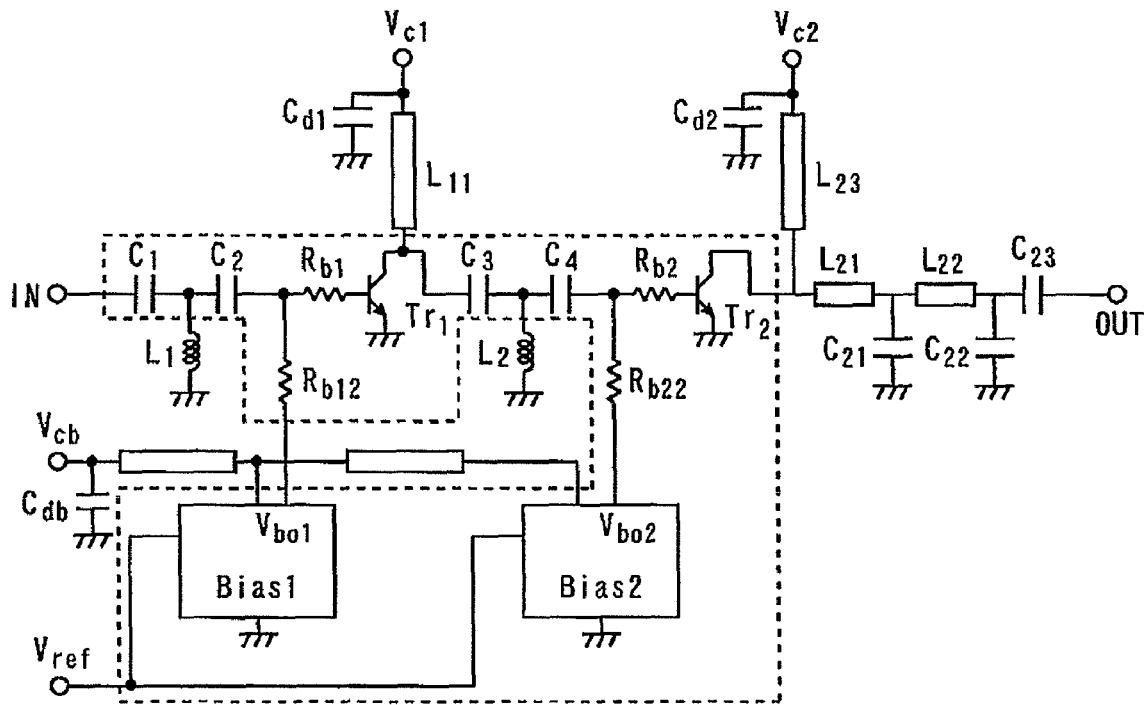
FIG. 25 is a circuit diagram showing an example of a GaAs-HBT power amplifier bias circuit according to a related art.
Figure 25B:
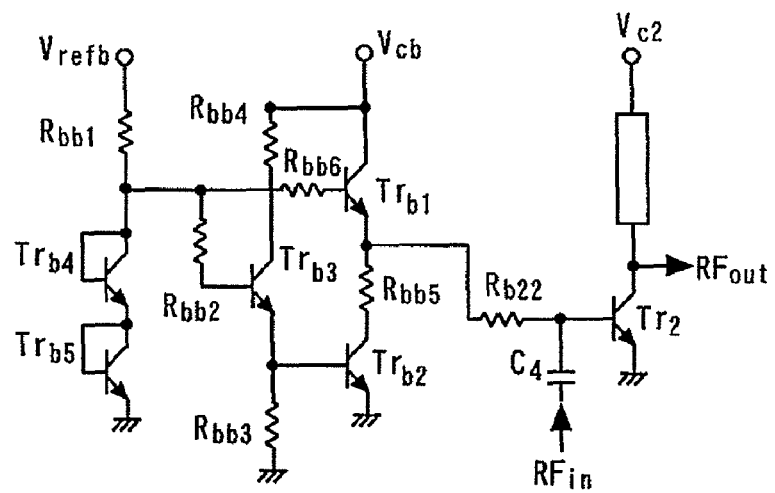

FIG. 1 is a circuit diagram showing a bias circuit for a GaAs-HBT power amplifier according to a first embodiment of the present invention. More specifically, FIG. 1 shows an exemplary configuration of a power amplifier and its bias circuit according to the first embodiment. This circuit uses GaAs-HBTs (Heterojunction Bipolar Transistors). In FIG. 1, those components common to the circuit diagrams shown in FIGS. 25 and 26 retain the same reference numerals and will not be described herein. Further, although the present embodiment will be described with reference to the second stage bias circuit of a two stage amplifier, it is to be understood that the embodiment may be applied to the first stage bias circuit, with the same effect.

The circuit configuration shown in FIG. 1 includes a voltage drive bias circuit and a current drive bias circuit connected in a parallel relationship to each other, wherein the voltage drive bias circuit typically includes an emitter follower and the current drive bias circuit directly applies a current to the base of the amplifier transistor through a high resistance. That is, the bias circuit shown in FIG. 1 includes a combination bias circuit in which the voltage drive bias circuit and the current drive bias circuit are connected in a parallel relationship to each other. A first amplifier transistor (hereinafter referred to as Tr2a) is driven by this combination bias circuit. Further, a second amplifier transistor (hereinafter referred to as Tr2b) is connected in a parallel relationship to Tr2a. This transistor Tr2b is driven only by a current drive bias circuit.

Specifically, the circuit shown in FIG. 1 includes a voltage drive bias circuit (including transistors Trb1 to Trb3) connected to the base of Tr2a. Further, a current drive bias circuit (including a resistance Rbb9) is connected in a parallel relationship to the voltage drive bias circuit and also connected to the base of Tr2a. The voltage drive bias circuit and the current drive bias circuit described above are connected to a reference voltage input terminal (hereinafter referred to as Vrefb) to which a reference voltage is externally applied.

In FIG. 1, symbols Trb1 to Trb3 denote heterojunction bipolar transistors (HBTs); Rbb1 to Rb22, resistive elements; Vcb, Vcb2, Vrefb, and Vc2, voltage input terminals (power terminals); and Ca and C4, capacitive elements.

The configuration of the voltage drive bias circuit shown in FIG. 1 will now be described. This voltage drive bias circuit includes first to third transistors (Trb1 to Trb3) and resistive elements.

The base of the above first transistor (hereinafter referred to simply as Trb1) is connected to Vrefb via Rbb1 and Rbb6. The emitter of Trb1 is connected to the base of Tr2a. A bias current corresponding to the reference voltage is supplied to the base of Tr2a.

The collector of the above second transistor (hereinafter referred to simply as Trb2) is connected to the junction between the emitter of Trb1 and the base of Tr2a through the first resistance Rbb5 (hereinafter referred to simply as Rbb5).

The base of the above third transistor (hereinafter referred to simply as Trb3) is connected to Vrefb through the second resistance Rbb1 (hereinafter referred to simply as Rbb1) and a fourth resistance Rbb2. Further, the emitter of Trb3 is connected to the base of Trb2 to supply a bias current corresponding to the reference voltage to Trb2.

A current drive bias circuit shown in FIG. 1 will now be described. This current drive bias circuit includes a third resistance (hereinafter referred to simply as Rbb9). One end of Rbb9 is connected to Vrefb, and the other end is connected to the base of Tr2a.

The fourth resistance Rb22 (hereinafter referred to simply as Rb22) is connected between the base of Tr2a and the junction (Vbo) between Rbb9 and Trb1. The current Ib21 supplied from the voltage drive bias circuit and the current Ib22 supplied from the current drive bias circuit described above are delivered to the base of Tr2a via Rb22.

The operation of the voltage drive bias circuit and the current drive bias circuit will now be described. The transistor Trb1 in the voltage drive bias circuit does not turn on when the voltage applied to its base is lower than a predetermined threshold voltage (Vth1). That is, when the base voltage supplied from Vrefb is lower than the threshold voltage (Vth1) for turning on Trb1, Trb1 does not turn on. The first current (Ib22) is supplied from Vrefb to the base of Tr2a via Rbb9, i.e., via the current drive bias circuit.

When the voltage applied to the base of Trb1 in the voltage drive bias circuit is equal to or higher than the threshold voltage Vth1, on the other hand, Trb1 turns on so that Ib21 flows from its emitter. The current Ib21 is delivered from the emitter of Trb1 to Tr2a. That is, when the base voltage supplied from Vrefb is equal to or higher than Vth1, the second current (Ib21) is supplied from Vrefb to the base of Tr2a through the voltage drive bias circuit, in addition to the first current (Ib22).

Further, in the circuit shown in FIG. 1, Tr2b is connected in a parallel relationship to Tr2a. A second amplifying device-side resistance Rbb13 (hereinafter referred to simply as Rbb13) is connected between the base of Tr2b and Vrefb. The collectors of Tr2a and Tr2b are connected to the power terminal Vc2. The bases of these transistors are connected together through the capacitive element Ca.

A third current (Ib23) is supplied from Vref to the base of Tr2b via Rbb13. When the base voltage of the transistor Tr2b is equal to or higher than its threshold voltage (Vth2) which is the minimum voltage required to turn on Tr2b, this transistor turns on. That is, Tr2b is turned on and off by the bias current corresponding to the reference voltage.

Figure 26:
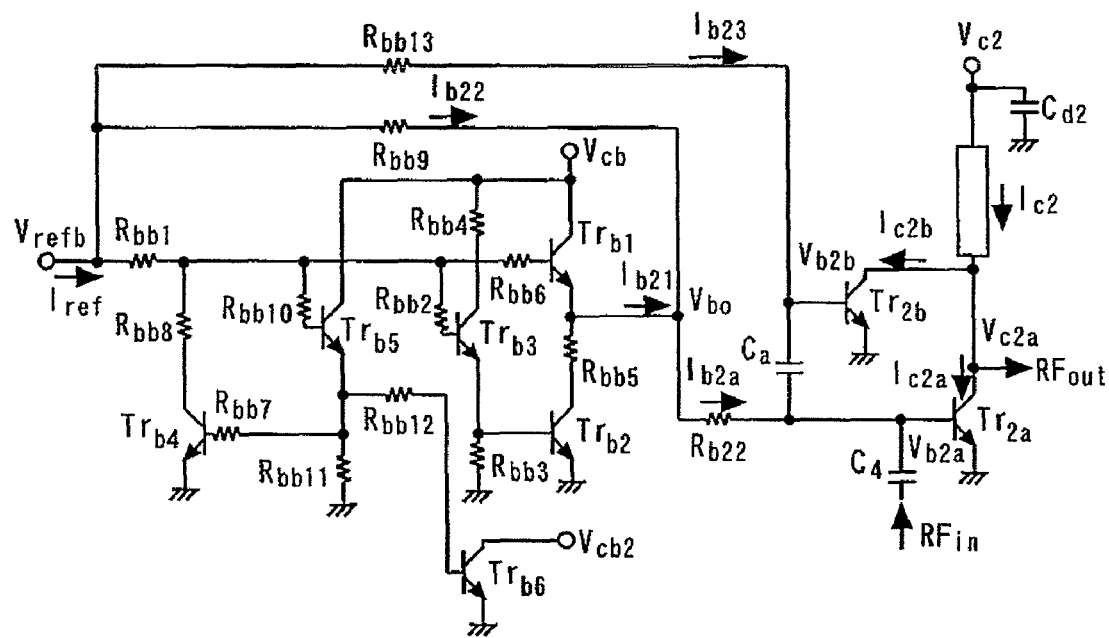
FIG. 26 is a circuit diagram showing an example of a GaAs-HBT power amplifier bias circuit capable of low voltage operation.

The foregoing description is common to the bias circuit shown in FIG. 26 which is operable at low values of Vref.

The power amplifier bias circuit of the first embodiment shown in FIG. 1 is similar to the above bias circuit operable at low values of Vref, but additionally includes an idle current control circuit 10 which uses the collector voltage Vc2. In FIG. 1, symbols Trx1 to Trx3 denotes the transistors in the idle current control circuit 10 (also referred to as "control transistors," for convenience); Rx1 to Rx6, resistances (also referred to as "control resistances," for convenience); and Dx1 and Dx2, Schottky barrier diodes.

Specifically, the idle current control circuit 10 includes a first control section transistor Trx1 (hereinafter referred to simply as Trx1). The collector of Trx1 is connected between the base of Tr2a and the parallel connection of the voltage drive bias circuit and the current drive bias circuit, that is, connected between Rb22 and the base of Tr2a. The idle current control circuit 10 also includes a second control section transistor Trx2 (hereinafter referred to simply as Trx2). The collector of Trx2 is connected to the base of Trx1. As a result, since a current corresponding to the collector voltage Vc2 of Tr2a is supplied to the base of Trx2, a current also corresponding to the collector voltage Vc2 of Tr2a is supplied to the base of Trx1.

The idle current control circuit 10 also includes a first control section resistance Rx1 (hereinafter referred to simply as Rx1) and a second control section resistance Rx2 (hereinafter referred to simply as Rx2). One end of Rx1 is connected to the collector of Trx1, and the other end is connected between Rb22 and the base of Tr2a. Likewise, one end of Rx2 is connected to the collector of Trx1, and the other end is connected between Rbb13 and the base of Tr2b. It should be noted that the one ends of Rx1 and Rx2 are connected to the collector of Trx 1 via a Schottky barrier diode Dx1.

Figure 2:
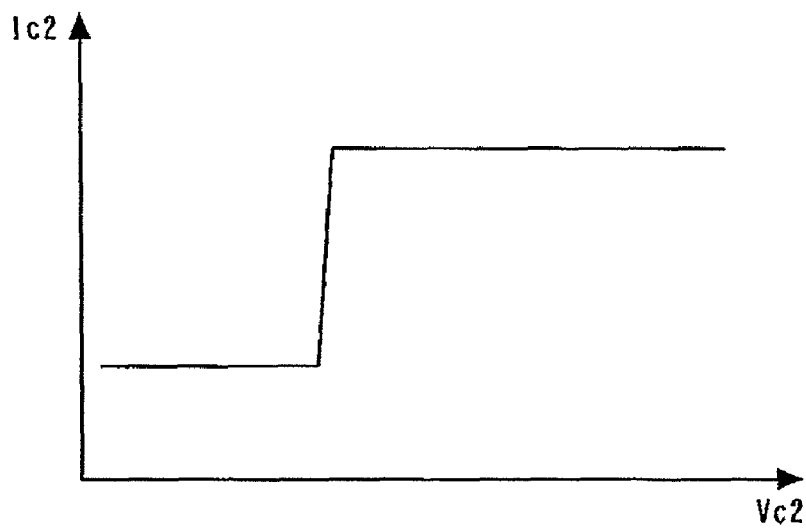
FIG. 2 is a schematic diagram illustrating the idle current of an amplifier transistor when the transistor is driven by the GaAs-HBT power amplifier bias circuit of the first embodiment.

FIG. 2 is a schematic diagram illustrating the idle current of an amplifier transistor when the transistor is driven by the GaAs-HBT power amplifier bias circuit of the first embodiment. When the collector voltage Vc2 of the amplifier transistor is lower than the threshold voltage of Trx2 (approximately 1.3 V), Trx2 is turned off. Since the reference voltage Vref (2.4-2.5 V) is higher than the minimum voltage required to turn on both Trx1 and Dx2 (namely, approximately 1.3 V plus 0.7 V), a current Ix1 (see FIG. 1) flows, thus turning Trx1 on. As a result, a current is drawn from the bases of Tr2a and Tr2b to GND through the resistances Rx1 and Rx2, so that the idle current of each transistor Tr2a, Tr2b decreases.

The value of this idle current, when the collector voltage Vc2 is low, can be arbitrarily set by changing the values of the resistances Rx1 and Rx2. That is, the values of the resistances Rx1 and Rx2 may be so determined that the idle current is adjusted to the desired optimum value during low and medium output operation (i.e., during low Vc2 operation).

When the collector voltage Vc2 is equal to or higher than the threshold voltage of Trx2, on the other hand, Trx2 is turned on and as a result a collector current flows. Since there is a resulting voltage drop across the resistance Rx4, the voltage on the collector terminal of Trx2 (i.e., the voltage on the base terminal of Trx1) drops, so that Trx1 is not turned on. As a result, no current is drawn from the bases of Tr2a and Tr2b and hence the idle current does not decrease, which is the opposite to the operation described above.

FIG. 2 shows the idle current characteristics of the amplifier transistor driven by the power amplifier bias circuit of the first embodiment (i.e., shows the result of the foregoing circuit operation). As shown, the present embodiment allows the idle current to be reduced to an arbitrary value when Vc2 is reduced to 1.3 V (the threshold voltage of Trx2) or less. Thus, the bias current control circuit 10 can be used to optimize the idle current of an amplifier transistor during its low or medium output operation (i.e., during low Vc2 operation), thus allowing the amplifier transistor to exhibit low distortion characteristics.

According to the first embodiment as described above, the idle current control circuit 10 controls the idle current Ic2 in accordance with the collector voltage Vc2 of the amplifier transistor Tr2a. This allows the idle current to be adjusted to an appropriate value with respect to the output power when the collector voltage Vc2 of the amplifier transistor Tr2a is reduced during its low and medium output operation. Thus, the idle current Ic2 can be adjusted in accordance with the collector voltage Vc2 of the amplifier transistor Tr2a so that the amplifier transistor exhibits low distortion characteristics. Therefore, according to the first embodiment, in an HBT power amplifier in which a bias circuit capable of power amplification operation at low values of Vref (2.4-2.5 V) is integrated on the same GaAs chip as the amplifier transistor, the idle current of the amplifier transistor may be adjusted to the optimum value with respect to its collector voltage so that the amplifier exhibits low distortion characteristics. According to the first embodiment, the idle current, when the collector voltage Vc2 is low, can be set to an arbitrary value by changing the values of Rx1 and Rx2. As a result, the idle current can be adjusted to the desired optimum value during low and medium output operation (i.e., during low Vc2 operation).

Second Embodiment

Figure 3:
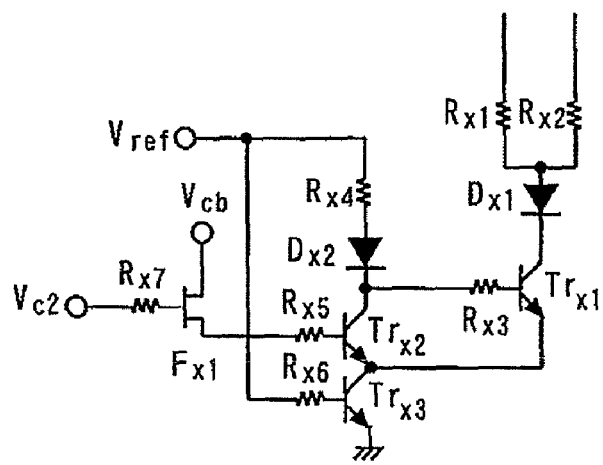
FIG. 3 is a circuit diagram showing the idle current control circuit of a GaAs-HBT power amplifier bias circuit according to a second embodiment of the present invention.

FIG. 3 is a circuit diagram showing the idle current control circuit of a GaAs-HBT power amplifier bias circuit according to a second embodiment of the present invention. Specifically, the circuit diagram shown in FIG. 3 is a part of a circuit diagram of the GaAs-HBT power amplifier bias circuit of the second embodiment, and illustrates the idle current control circuit 10 which uses the collector voltage Vc2 of the amplifier transistor. The power amplifier bias circuit of the second embodiment differs from that of the first embodiment in that the idle current control circuit 10 using the collector voltage Vc2 additionally includes an FET (Field Effect Transistor) connected to the Vc2 terminal side, which characterizes the second embodiment. The following description of the configuration of the second embodiment will focus on the differences from the first embodiment.

As shown in FIG. 3, the idle current control circuit 10 of the second embodiment includes a first FET (Field Effect Transistor) Fx1. According to the second embodiment, the FET Fx1 is a depletion mode FET (which has a negative threshold voltage). The gate of the FET Fx1 is connected to the collector voltage Vc2 through a resistance Rx7. A bias current corresponding to the reference voltage Vref is supplied to the base of the transistor Trx2.

Figure 4:
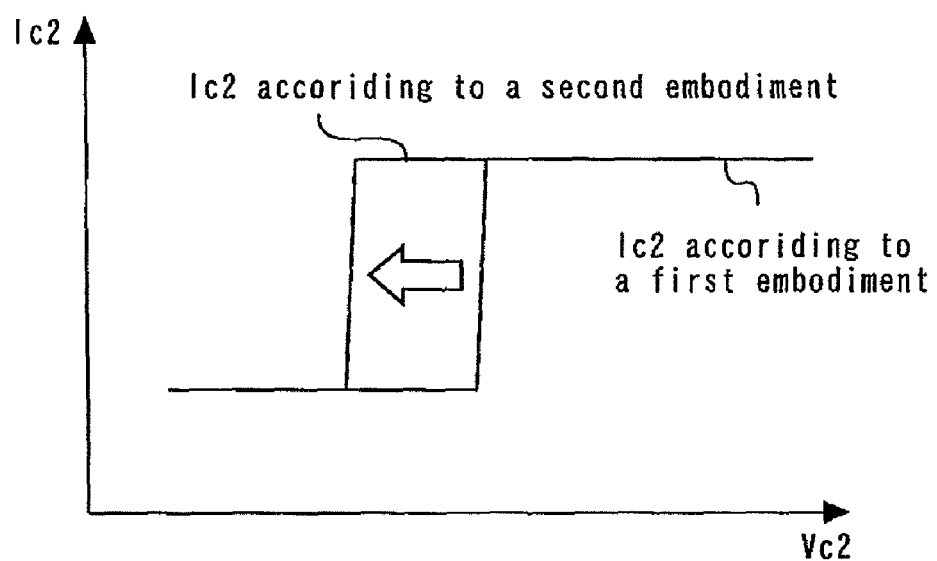
FIG. 4 is a schematic diagram illustrating the idle current of an amplifier transistor when the transistor is driven by the GaAs-HBT power amplifier bias circuit of the second embodiment.

FIG. 4 is a schematic diagram illustrating the idle current of an amplifier transistor when the transistor is driven by the GaAs-HBT power amplifier bias circuit of the second embodiment. The bias circuit of the second embodiment operates so as to reduce the collector voltage Vc2 at which the idle current transitions between high and low levels by an amount equal to the gate-source voltage of the first field effect transistor Fx1 (the gate being negative relative to the source), as compared with the bias circuit of the first embodiment.

It should be noted that although in the second embodiment the PET Fx1 is a depletion mode PET (which has a negative threshold voltage), it is to be understood that in other embodiments the PET Fx1 may be an enhancement FET (which has a positive threshold voltage). In such a case, the bias circuit operates so as to increase the collector voltage Vc2 at which the idle current of the amplifier transistor transitions between high and low levels, as compared with the bias circuit of the first embodiment.

Third Embodiment

Figure 5:
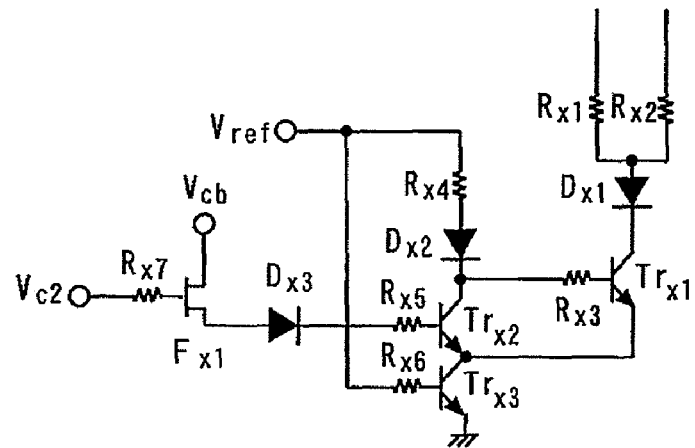
FIG. 5 is a circuit diagram showing the idle current control circuit of a GaAs-HBT power amplifier bias circuit according to a third embodiment of the present invention.

FIG. 5 is a circuit diagram showing the idle current control circuit of a GaAs-HBT power amplifier bias circuit according to a third embodiment of the present invention. Specifically, the circuit diagram shown in FIG. 5 is a part of a circuit diagram of the GaAs-HBT power amplifier bias circuit of the third embodiment, and illustrates the idle current control circuit 10 which uses the collector voltage Vc2 of the amplifier transistor. The power amplifier bias circuit of the third embodiment differs from that of the second embodiment in that the idle current control circuit 10 using the collector voltage Vc2 additionally includes a Schottky barrier diode Dx3 connected to the Vc2 terminal side (see FIG. 5), which characterizes the third embodiment.

Specifically, in the third embodiment the Schottky barrier diode Dx3 is connected between the FET Fx1 and the resistance Rx5, as shown in FIG. 5. The anode of Dx3 is connected to the source of Fx1, and the cathode of Dx3 is connected to the base of Trx2.

Figure 6:
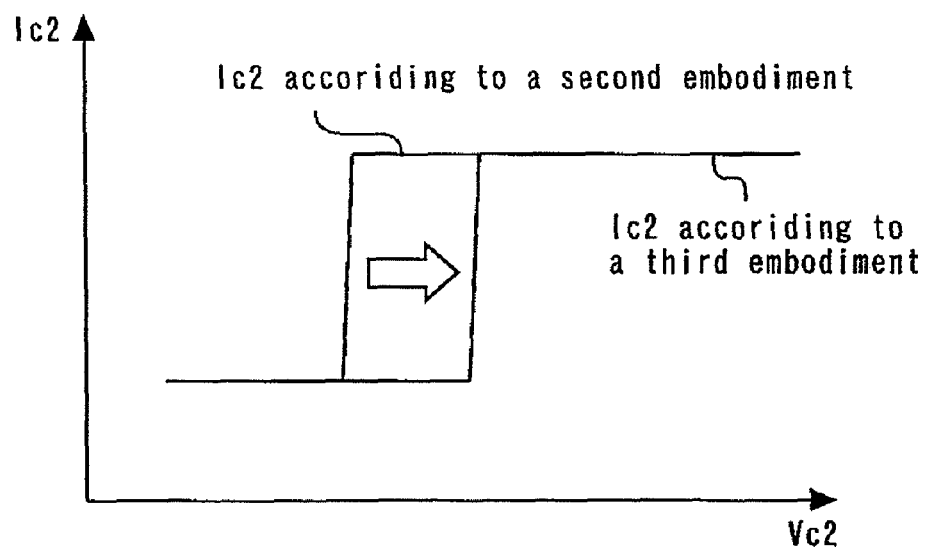
FIG. 6 is a schematic diagram illustrating the idle current of an amplifier transistor when the transistor is driven by the GaAs-HBT power amplifier bias circuit of the third embodiment.

FIG. 6 is a schematic diagram illustrating the idle current of an amplifier transistor when the transistor is driven by the GaAs-HBT power amplifier bias circuit of the third embodiment. The bias circuit of the present embodiment operates so as to increase the collector voltage at which the idle current transitions between high and low levels by an amount equal to the on-voltage of the Schottky barrier diode (i.e., approximately 0.7 V), as compared with the bias circuit of the second embodiment.

Fourth Embodiment

Figure 7:
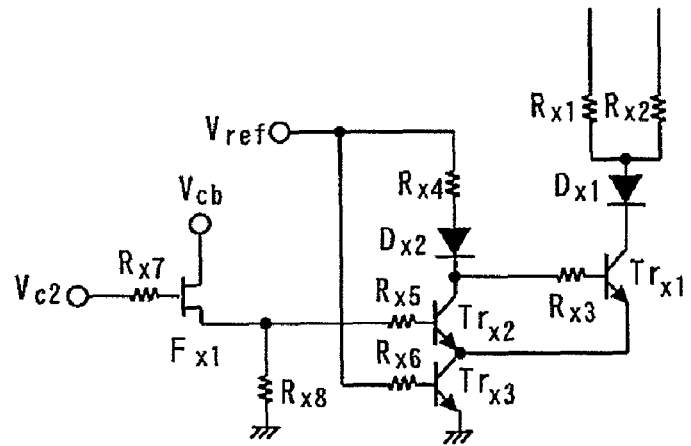
FIG. 7 is a circuit diagram showing the idle current control circuit of a GaAs-HBT power amplifier bias circuit according to a fourth embodiment of the present invention.

FIG. 7 is a circuit diagram showing the idle current control circuit of a GaAs-HBT power amplifier bias circuit according to a fourth embodiment of the present invention. Specifically, the circuit diagram shown in FIG. 7 is a part of a circuit diagram of the GaAs-HBT power amplifier bias circuit of the fourth embodiment, and illustrates the idle current control circuit 10 which uses the collector voltage Vc2 of the amplifier transistor. The power amplifier bias circuit of the fourth embodiment differs from that of the second embodiment in that the idle current control unit 10 using the collector voltage Vc2 additionally includes a shunt resistance Rx8 (hereinafter referred to simply as Rx8) connected to the source of the FET (Fx1) which is connected to the Vc2 terminal side (see FIG. 7). The fourth embodiment is characterized by this feature.

Figure 8:
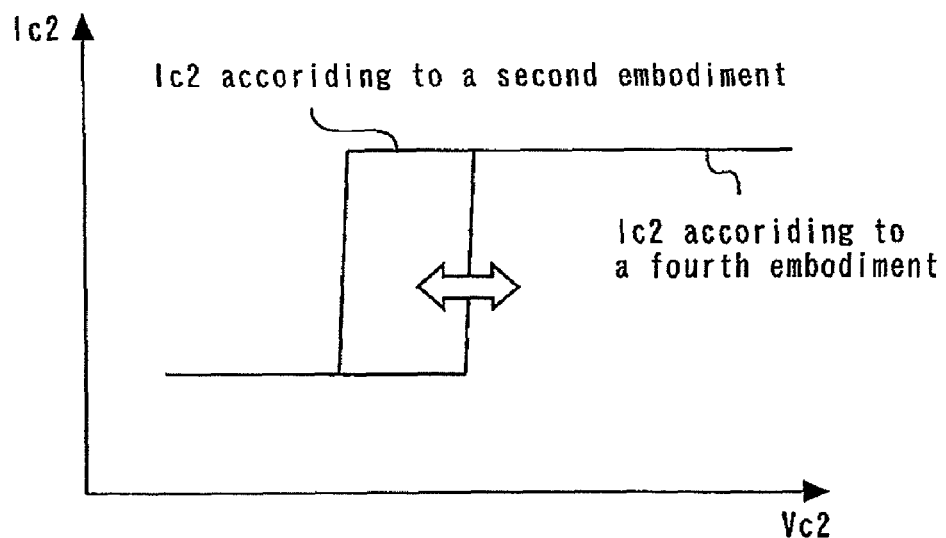
FIG. 8 is a schematic diagram illustrating the idle current of an amplifier transistor when the transistor is driven by the GaAs-HBT power amplifier bias circuit of the fourth embodiment.

FIG. 8 is a schematic diagram illustrating the idle current of an amplifier transistor when the transistor is driven by the GaAs-HBT power amplifier bias circuit of the fourth embodiment. In the bias circuit of the fourth embodiment, a current corresponding to the resistance value of the shunt resistance Rx8 flows through the resistance Rx8, so that the source voltage of Fx1 decreases, as compared with the bias circuit of the second embodiment. As a result, the collector voltage Vc2 at which the idle current transitions between high and low levels is increased by an amount corresponding to the resistance value of the resistance Rx8. Therefore, by appropriately adjusting the resistance value of Rx8, the collector voltage Vc2 at which the idle current transitions between the high and low levels can be set to an arbitrary value within a range wider than that permitted by the second embodiment.

Fifth Embodiment

Figure 9:
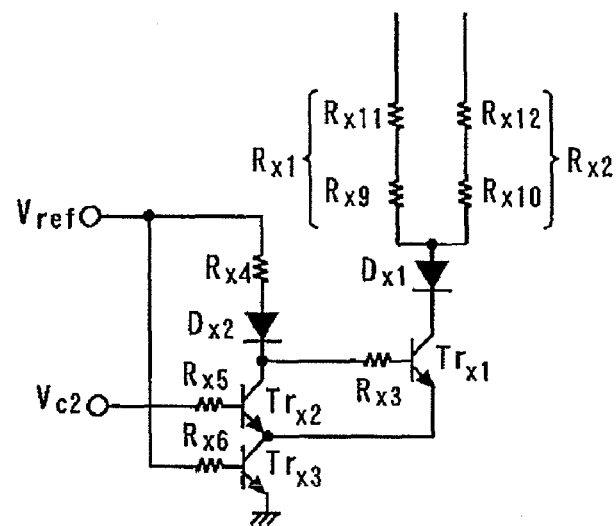
FIG. 9 is a circuit diagram showing the idle current control circuit of a GaAs-HBT power amplifier bias circuit according to a fifth embodiment of the present invention.

FIG. 9 is a circuit diagram showing the idle current control circuit of a GaAs-HBT power amplifier bias circuit according to a fifth embodiment of the present invention. Specifically, the circuit diagram shown in FIG. 9 is a part of a circuit diagram of the GaAs-HBT power amplifier bias circuit of the fifth embodiment, and illustrates the idle current control circuit 10 which uses the collector voltage Vc2 of the amplifier transistor. In FIG. 9, symbols Rx9 and Rx10 denote resistances formed of a thin film metal (e.g., NiCr), and Rx11 and Rx12 denote resistances formed in a semiconductor layer, e.g., a base layer (hereinafter referred to as "epi-resistances"). The power amplifier bias circuit of the fifth embodiment differs from that of the first embodiment in that in the idle current control circuit 10, the first control section resistance Rx1 and the second control section resistance Rx2 are each made up of an epi-resistance and a thin film metal resistance, which characterizes the fifth embodiment.

Thus, according to the fifth embodiment, the first and second control section resistances Rx1 and Rx2 are each made up of a thin film metal resistance and an epi-resistance. Epi-resistances have a positive temperature coefficient, while the resistance value of NiCr resistances is not temperature dependent. Therefore, according to the fifth embodiment, the temperature dependence of the resistance values of the resistances Rx1 and Rx2 can be varied. This makes it possible to optimize the temperature dependence of the idle current of the amplifier transistor during its low Vc2 operation.

Sixth Embodiment

Figure 10:
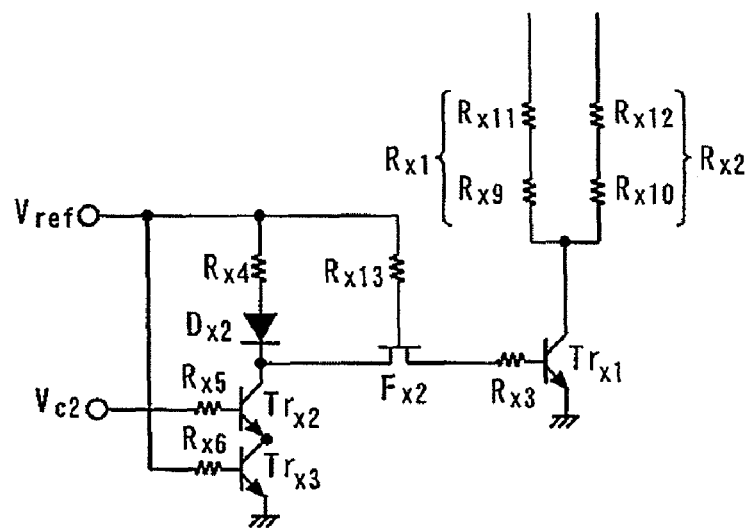
FIG. 10 is a circuit diagram showing the idle current control circuit of a GaAs-HBT power amplifier bias circuit according to a sixth embodiment of the present invention.

FIG. 10 is a circuit diagram showing the idle current control circuit of a GaAs-HBT power amplifier bias circuit according to a sixth embodiment of the present invention. Specifically, the circuit diagram shown in FIG. 10 is a part of a circuit diagram of the GaAs-HBT power amplifier bias circuit of the sixth embodiment, and illustrates the idle current control circuit 10 which uses the collector voltage Vc2 of the amplifier transistor. The idle current control circuit 10 of the sixth embodiment differs in one respect from that of the fifth embodiment in that it does not include the diode Dx1.

Further, the idle current control circuit 10 of the sixth embodiment additionally includes a second field effect transistor Fx2 (hereinafter referred to simply as Fx2). The gate of Fx2 is connected to the Vref terminal through the resistance Rx13. Further, Rx3 connected to the base of Trx1 is connected to the collector of Trx2 through the source and drain of Fx2.

To sum up, the idle current control circuit 10 of the sixth embodiment differs from that of the fifth embodiment in that it does not includes the diode Dx1 and that an FET is connected between the resistance Rx3 and the collector of the transistor Trx2. In the sixth embodiment, since the diode Dx1 is omitted, it is possible to increase the resistance value of the Rx1 (first control section resistance) and the resistance value of the Rx2 (second control section resistance), as compared with the fifth embodiment. This means that these resistances can be used to vary the temperature dependence of the idle current of the amplifier transistor over a wider range than in the fifth embodiment; that is, they have better controllability of the temperature dependence of the idle current.

On the other hand, the reason for the addition of the FET Fx2 in the idle current control circuit of the sixth embodiment is that without the FET Fx2 a leakage current would flow from the Vc2 terminal and pass through Rx5, Trx2, Rx3, Trx1, Rx1 (or Rx2), and Tr2a (or Tr2b) since the diode Dx1 has been omitted. It should be noted that this leakage current is the consumption current of the power amplifier when Vref=0 V and Vc2≠0 V. Thus, the sixth embodiment allows the diode Dx1 to be omitted by adding the second field effect transistor Fx2 and thereby reducing the leakage current.

According to the sixth embodiment as described above, it is possible to increase the resistance values of the first and second control section resistances Rx1 and Rx2 (which are temperature dependent) without increasing the leakage current, resulting in better controllability of the temperature dependence of the idle current of the amplifier transistor.

Seventh Embodiment

Figure 11:
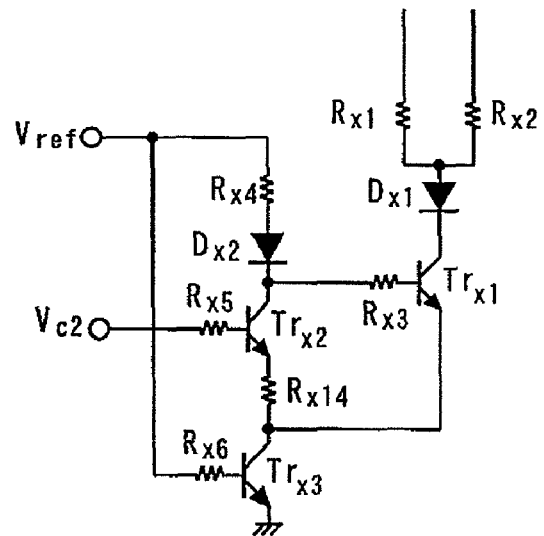
FIG. 11 is a circuit diagram showing the idle current control circuit of a GaAs-HBT power amplifier bias circuit according to a seventh embodiment of the present invention.

FIG. 11 is a circuit diagram showing the idle current control circuit of a GaAs-HBT power amplifier bias circuit according to a seventh embodiment of the present invention. Specifically, the circuit diagram shown in FIG. 11 is a part of a circuit diagram of the GaAs-HBT power amplifier bias circuit of the seventh embodiment, and illustrates the idle current control circuit 10 which uses the collector voltage Vc2 of the amplifier transistor. The idle current control circuit 10 of the seventh embodiment is characterized by the use of a third control section resistance Rx14 (hereinafter referred to simply as Rx14). Rx14 is connected between the emitter of Trx2 and the collector of a third control section transistor (hereinafter referred to simply as Trx3). The collector of Trx3 is connected to the emitter of Trx2, and the base of Trx3 is connected to Vref.

Figure 12:
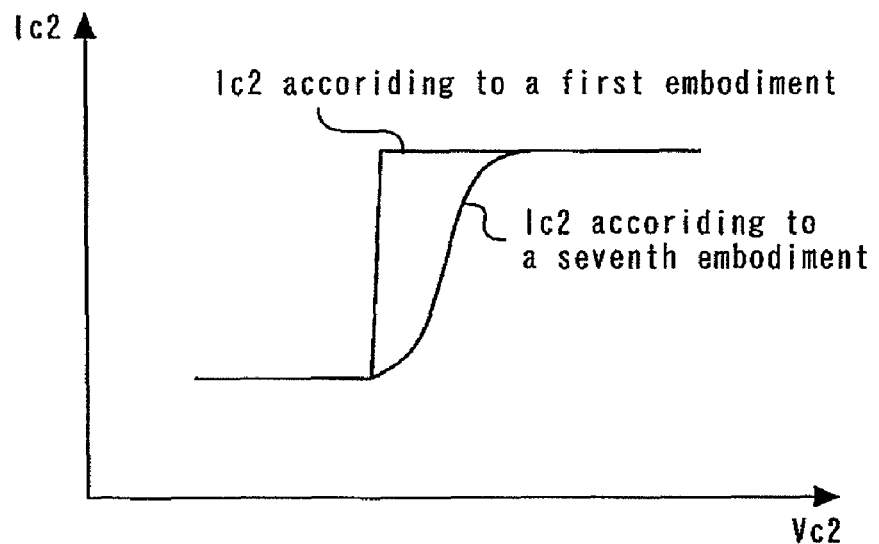
FIG. 12 is a schematic diagram illustrating the idle current of an amplifier transistor when the transistor is driven by the GaAs-HBT power amplifier bias circuit of the seventh embodiment.

FIG. 12 is a schematic diagram illustrating the idle current of an amplifier transistor when the transistor is driven by the GaAs-HBT power amplifier bias circuit of the seventh embodiment. When the collector voltage Vc2 of the amplifier transistor is increased beyond a predetermined value, the collector current of Trx2 rises from a low value to a high value gradually due to the action of Rx14 and not instantaneously as in the first embodiment. That is, the present embodiment allows the idle current to be controlled in an analog manner (not in a digital manner).

Eighth Embodiment

Figure 13:
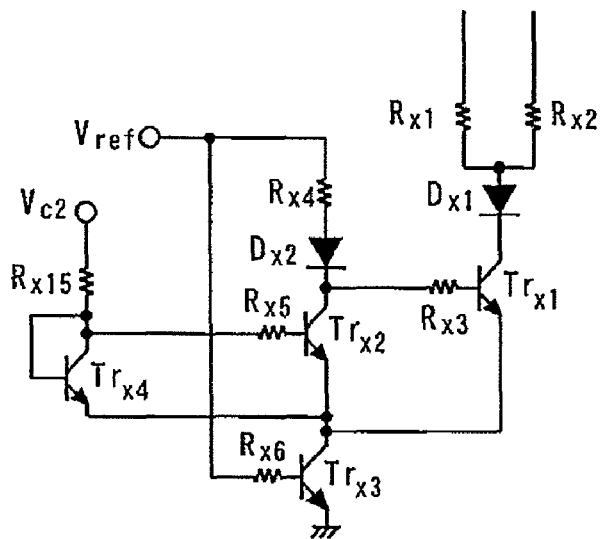
FIG. 13 is a circuit diagram showing the idle current control circuit of a GaAs-HBT power amplifier bias circuit according to an eighth embodiment of the present invention.

FIG. 13 is a circuit diagram showing the idle current control circuit of a GaAs-HBT power amplifier bias circuit according to an eighth embodiment of the present invention. Specifically, the circuit diagram shown in FIG. 13 is a part of a circuit diagram of the GaAs-HBT power amplifier bias circuit of the eighth embodiment, and illustrates the idle current control circuit 10 which uses the collector voltage Vc2 of the amplifier transistor. The power amplifier bias circuit of the eighth embodiment differs from that of the first embodiment in that the idle current control unit 10 using the collector voltage Vc2 additionally includes a FET and a resistance (Rx15) connected to the Vc2 terminal side, which characterizes the eighth embodiment.

Specifically, as shown in FIG. 13, the idle current control circuit 10 of the eighth embodiment includes a fourth control section resistance Rx15 (hereinafter referred to simply as Rx15) and a fourth control section transistor Trx4 (hereinafter referred to simply as Trx4). The collector and base of Trx4 are connected to the terminal Vref and also connected to the base of Trx2. One end of Rx15 is connected to the collector and base of Trx4, and the other end is connected to Vref. According to the eighth embodiment, Trx2 is driven by a current mirror circuit formed by Trx4 and Rx15 described above.

Figure 14:
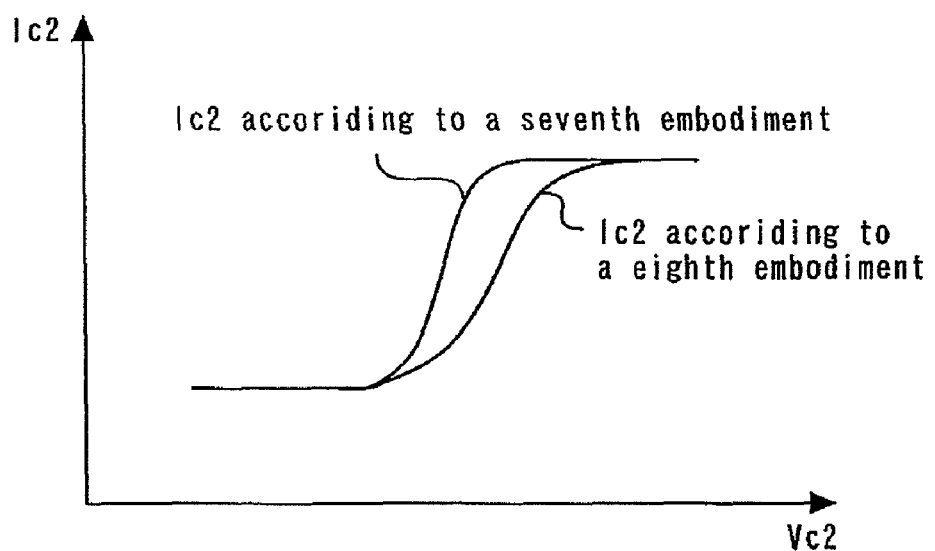
FIG. 14 is a schematic diagram illustrating the idle current of an amplifier transistor when the transistor is driven by the GaAs-HBT power amplifier bias circuit of the eighth embodiment.

FIG. 14 is a schematic diagram illustrating the idle current of an amplifier transistor when the transistor is driven by the GaAs-HBT power amplifier bias circuit of the eighth embodiment.

In the first embodiment, Vc2 is used to control the base voltage of Trx2. Therefore, the collector current of Trx2 undergoes a rapid change with Vc2 in the neighborhood of the threshold voltage of Trx2, resulting in a corresponding rapid change in the idle current of the amplifier transistor.

In the eighth embodiment, on the other hand, Trx2 is driven by the current mirror circuit formed by Trx4 and Rx15. Therefore, the collector current of Trx2 linearly changes with Vc2. That is, the idle current of the amplifier transistor can be gradually varied by selecting an appropriate resistance value for the resistance Rx15. In this way the idle current can be controlled in an analog manner. Further, the present embodiment allows the slope of the idle current increase with respect to Vc2 to be more gradual than in the seventh embodiment, resulting in better controllability of the idle current.

Ninth Embodiment

Figure 15:
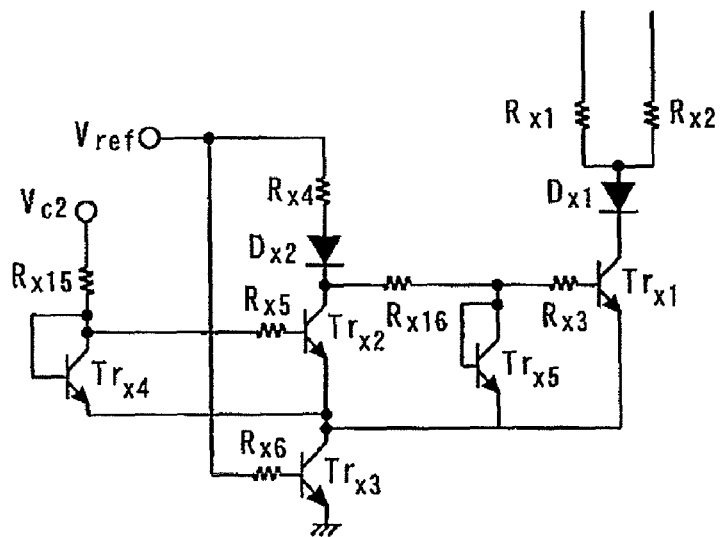
FIG. 15 is a circuit diagram showing the idle current control circuit of a GaAs-HBT power amplifier bias circuit according to a ninth embodiment of the present invention.

FIG. 15 is a circuit diagram showing the idle current control circuit of a GaAs-HBT power amplifier bias circuit according to a ninth embodiment of the present invention. Specifically, the circuit diagram shown in FIG. 15 is a part of a circuit diagram of the GaAs-HBT power amplifier bias circuit of the ninth embodiment, and illustrates the idle current control circuit 10 which uses the collector voltage Vc2 of the amplifier transistor. The idle current control circuit 10 of the ninth embodiment differs from that of the eighth embodiment in that it additionally includes a fifth control section resistance Rx16 (hereinafter referred to simply as Rx16) and a fifth control section transistor Trx5 (hereinafter referred to simply as Trx5) electrically connected between the collector of Trx2 and Rx3. The ninth embodiment is characterized by this feature.

Specifically, Rx16 is connected in series between the collector of Trx2 and Rx3 which is connected to the base of Trx1. The collector and base of Trx5 are connected between Rx16 and Rx3. As a result, Rx16 and Trx5 form a current mirror circuit for driving Trx1.

Figure 16:
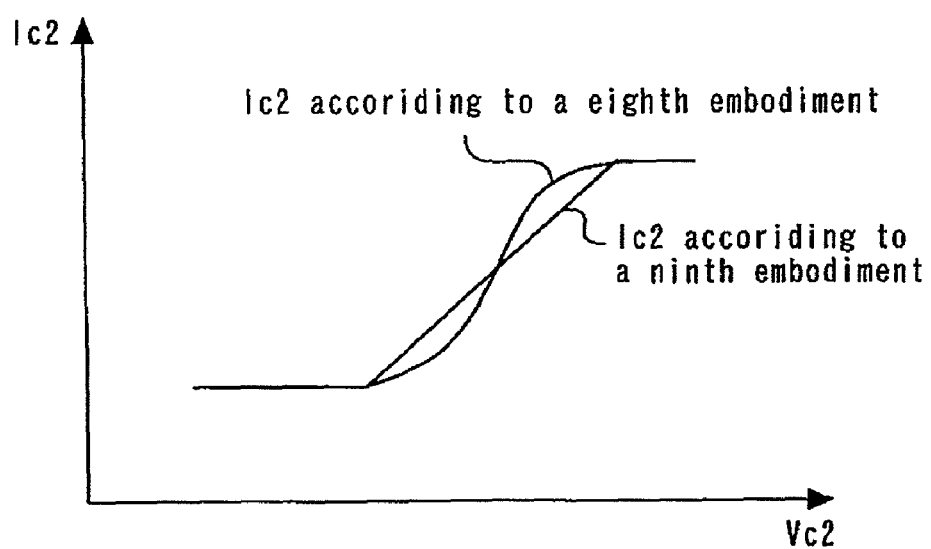
FIG. 16 is a schematic diagram illustrating the idle current of an amplifier transistor when the transistor is driven by the GaAs-HBT power amplifier bias circuit of the ninth embodiment.

FIG. 16 is a schematic diagram illustrating the idle current of an amplifier transistor when the transistor is driven by the GaAs-HBT power amplifier bias circuit of the ninth embodiment. In the ninth embodiment, since the collector current of Trx2 changes linearly with Vc2 (as described in connection with the eighth embodiment), the voltage on the collector terminal of Trx2 also changes linearly. Further, since Rx16 and Trx5 form a current mirror circuit for driving Trx1, the collector current of Trx1 linearly changes with the voltage on the collector terminal of Trx2. This means that the collector current of Trx1 linearly changes with Vc2. As a result, the idle current can be controlled in an analog manner with good linearity, as shown in FIG. 16.

Tenth Embodiment

Figure 17:
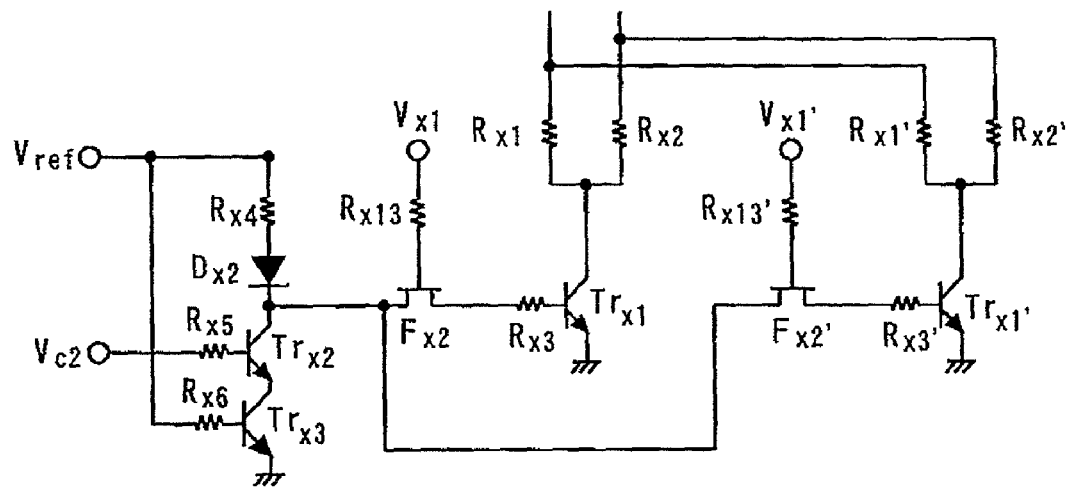
FIG. 17 is a circuit diagram showing the idle current control circuit of a GaAs-HBT power amplifier bias circuit according to a tenth embodiment of the present invention.

FIG. 17 is a circuit diagram showing the idle current control circuit of a GaAs-HBT power amplifier bias circuit according to a tenth embodiment of the present invention. Specifically, the circuit diagram shown in FIG. 17 is a part of a circuit diagram of the GaAs-HBT power amplifier bias circuit of the tenth embodiment, and illustrates the idle current control circuit 10 which uses the collector voltage Vc2 of the amplifier transistor. The power amplifier bias circuit of the ninth embodiment differs from that of the sixth embodiment in that it additionally includes a circuit made up of resistances Rx1' to Rx3' and Rx13', a transistor Trx1', and an FET Fx2' which correspond to the resistances Rx1 to Rx3 and Rx13, the transistor Trx1, and the FET Fx2, respectively, as shown in FIG. 17. The tenth embodiment is characterized by this feature.

The above additional circuit made up of Rx1' to Rx3', Rx13', Trx1' and Fx2' is also referred to as a "parallel circuit," for convenience, since this circuit is connected in parallel with Trx1. The parallel circuit is connected to the junction between Rb22 and the base of Tr2a (hereinafter referred to as the "first junction") and to the junction between the base of Trx1 and the collector of Trx2 (hereinafter referred to as the "second junction"). The collector of Trx1' is connected to the first junction, and the base of Trx1' is connected to the second junction. Fx2' is electrically connected between the base of Trx1' and the second junction, and functions as a switching device to electrically connect the base of Trx1' to and disconnect it from the second junction in response to the voltage on the terminal Vx1'. The terminals Vx1 and Vx1' receive voltages for controlling Fx2 and Fx2', respectively, as shown in the circuit diagram of FIG. 17.

Figure 18:
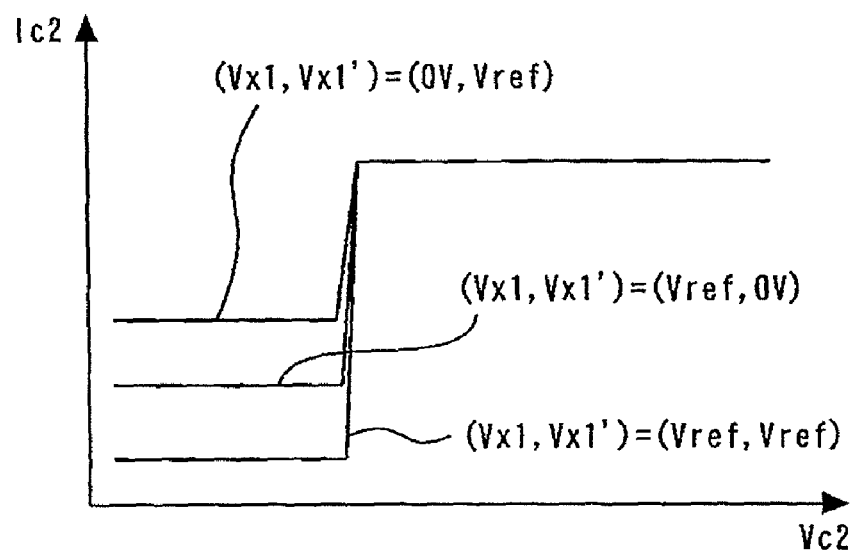
FIG. 18 is a schematic diagram illustrating the idle current of an amplifier transistor when the transistor is driven by the GaAs-HBT power amplifier bias circuit of the tenth embodiment.

FIG. 18 is a schematic diagram illustrating the idle current of an amplifier transistor when the transistor is driven by the GaAs-HBT power amplifier bias circuit of the tenth embodiment. In the tenth embodiment, if the voltages applied to Vx1 and Vx1' are such that Fx2 is turned on and Fx2' is turned off, that is, for example, if the voltage Vref is applied to Vx1 and a voltage of 0 V is applied to Vx1', then a collector current does not flow in Trx1', although a collector current flows in Trx1. Therefore in this case, the idle current, when Vc2 is low, is determined by the resistance values of Rx1 and Rx2.

On the other hand, if the voltages applied to Vx1 and Vx1' are such that Fx2 is turned off and Fx2' is turned off, that is, for example, if a voltage of 0 V is applied to Vx1 and the voltage Vref is applied to Vx1', then a collector current does not flow in Trx1, although a collector current flows in Trx1'. Therefore in this case, the idle current, when Vc2 is low, is determined by the resistance values of Rx1' and Rx2'.

Thus, in the tenth embodiment, the idle current, when Vc2 is low, can be changed by changing the voltages applied to Vx1 and Vx1'. Further, if the voltages applied to Vx1 and Vx1' are such that both Fx2 and Fx2' are turned on, that is, for example, if the voltage Vref is applied to both Vx1 and Vx1', then a collector current flows in each of Trx1 and Trx1'. In this way, the idle current, when Vc2 is low, may be set to a value different than those in the above two examples. It should be noted that FIG. 18 shows the idle current Ic2 when Rx1<Rx1' and Rx2<Rx2'.

In the tenth embodiment, the circuit made up of Rx1' to Rx3', Rx13', Trx1' and Fx2' is added to the bias circuit of the sixth embodiment. It should be noted, however, that a plurality of such circuits may be added to the sixth embodiment. In such cases, the added FETs (Fx2', Fx2'', Fx2''' . . . ) can be turned on and off arbitrarily by changing their base voltages. This allows the idle current to be set to a larger number of levels when Vc2 is low.

Eleventh Embodiment

Figure 19:
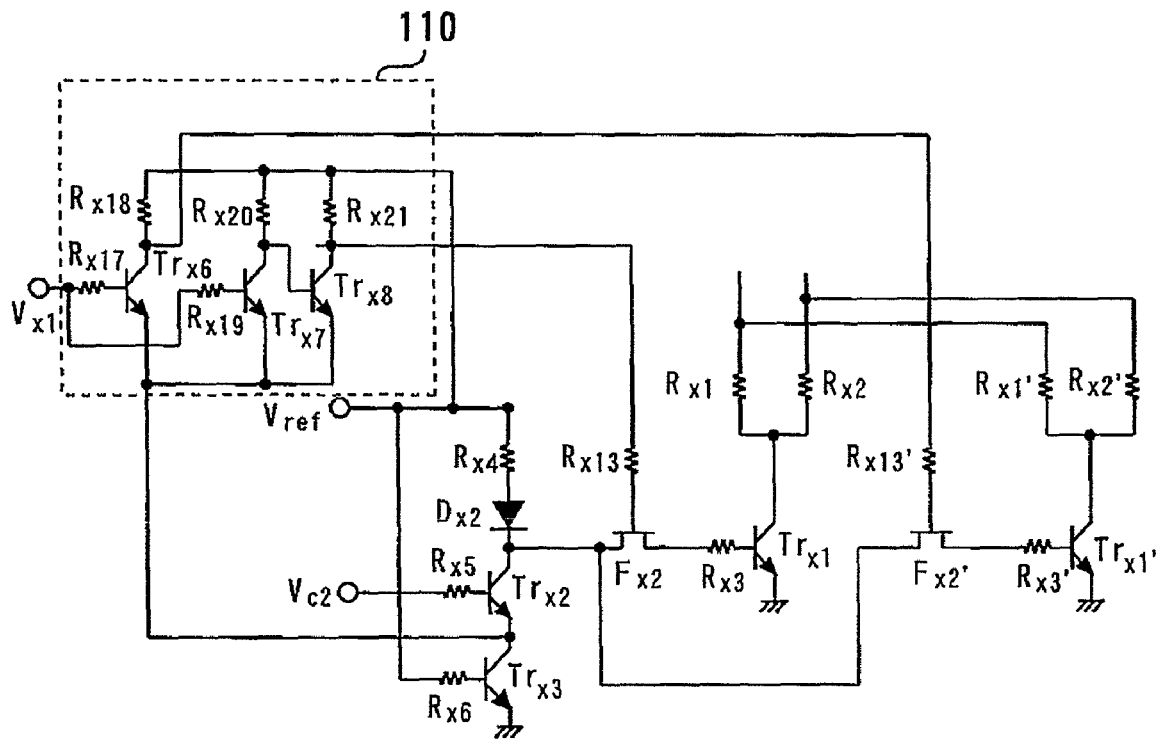
FIG. 19 is a circuit diagram showing the idle current control circuit of a GaAs-HBT power amplifier bias circuit according to an eleventh embodiment of the present invention.

FIG. 19 is a circuit diagram showing the idle current control circuit of a GaAs-HBT power amplifier bias circuit according to an eleventh embodiment of the present invention. Specifically, the circuit diagram shown in FIG. 19 is a part of a circuit diagram of the GaAs-HBT power amplifier bias circuit of the eleventh embodiment, and illustrates the idle current control circuit 10 which uses the collector voltage Vc2 of the amplifier transistor. The power amplifier bias circuit of the eleventh embodiment differs from that of the tenth embodiment in that it does not include the terminal Vx1', but instead includes a switching voltage generation circuit 110, which characterizes the eleventh embodiment. In the eleventh embodiment, the switching voltage generation circuit 110 produces the voltages applied to the gates of Fx2 and Fx2'.

The switching voltage generation circuit 110 is connected to the terminals Vx1 and Vref. Further, the switching voltage generation circuit 110 is connected to Fx2 via Rx13 and also connected to Fx2' via Rx13'. In FIG. 19, symbols Rx17 to Rx21 denote resistances, and Trx6 to Trx8 denote transistors (namely, transistors for generating a switching voltage). The base of Trx6 is connected to Vx1 via Rx17, and the collector of Trx6 is connected to Vref and also connected to Fx2' via Rx13'. The collector of Trx8 is connected to Vref and also connected to Fx2 via Rx13. The base of Trx7 is connected to Vx1 via Rx19, and the collector of Trx7 is connected to Vref and the base of Trx8. The switching voltage generation circuit 110 produces a high-level voltage at one output and a low-level voltage at the other output, or vice versa, depending on the voltage on Vx1. The high-level voltage is equal to the voltage on the terminal Vref and the low-level voltage is approximately 0.2 V.

Figure 20:
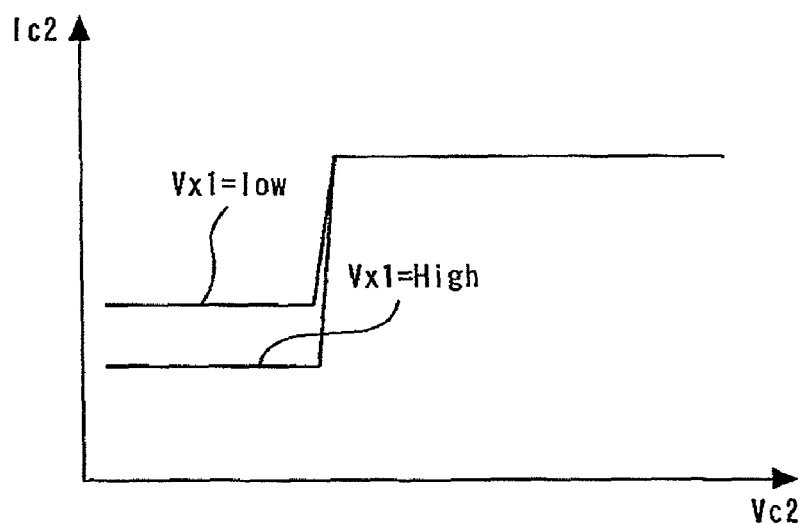
FIG. 20 is a schematic diagram illustrating the idle current of an amplifier transistor when the transistor is driven by the GaAs-HBT power amplifier bias circuit of the eleventh embodiment.

FIG. 20 is a schematic diagram illustrating the idle current of an amplifier transistor when the transistor is driven by the GaAs-HBT power amplifier bias circuit of the eleventh embodiment. The switching voltage generation circuit 110 of the eleventh embodiment made up of Rx17 to Rx21 and Trx6 to Trx8 produces a high-level voltage at one output and a low-level voltage at the other output, or vice versa, depending on the voltage on Vx1, wherein the high-level voltage is equal to the voltage on Vref and the low-level voltage is approximately 0.2 V. Thus, by using only one terminal Vx1, the bias circuit of the eleventh embodiment can switch between two output voltage levels which are used to adjust the idle current of the amplifier transistor to two different levels when Vc2 is low. It should be noted that the tenth embodiment requires two terminals Vx1 and Vx1' in order to receive two supply voltages, which is in contract with the above arrangement of the eleventh embodiment. For example, in the eleventh embodiment, if Vx1 is at a High voltage (e.g., 1.4 V or more), Fx2 is turned on and Fx2' is turned off. As a result, a current is drawn from the bases of the amplifier transistors Tr2a and Tr2b via Rx1 and Rx2. It should be noted that FIG. 20 shows the idle current Ic2 when Rx1<Rx1' and Rx2<Rx2'.

As described above, in the bias circuit of the eleventh embodiment, the field effect transistors Fx2 and Fx2' are turned on or off depending on the input voltage on the terminal Vx1. Therefore, the bias circuit can switch between two output voltage levels which are used to adjust the idle current of the amplifier transistor to two different levels when Vc2 is low. That is, selection of whether a current is to be drawn from the base of Tr2a through the Trx1 side or through the Trx1' side can be made by changing the voltage value of Vx1.

Twelfth Embodiment

Figure 21:
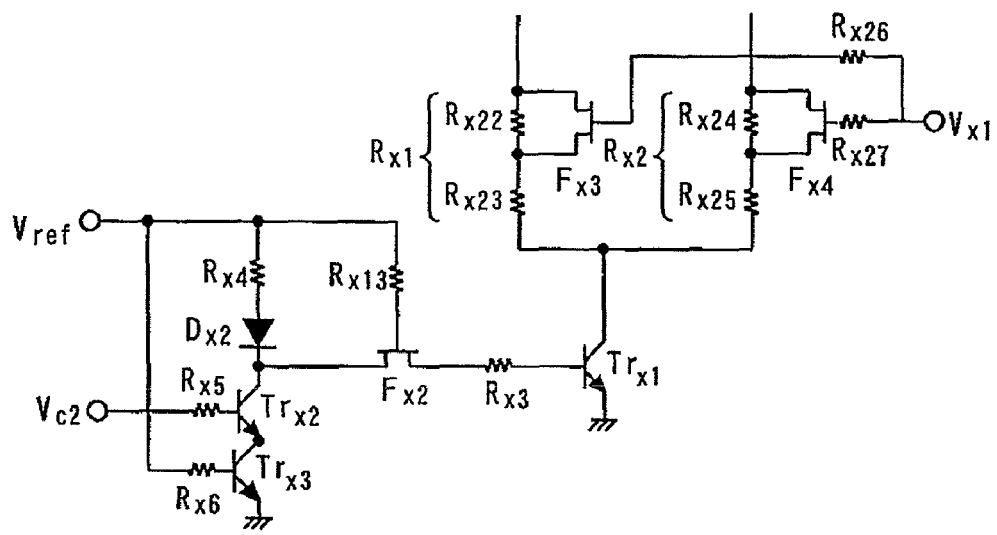
FIG. 21 is a circuit diagram showing the idle current control circuit of a GaAs-HBT power amplifier bias circuit according to a twelfth embodiment of the present invention.

FIG. 21 is a circuit diagram showing the idle current control circuit of a GaAs-HBT power amplifier bias circuit according to a twelfth embodiment of the present invention. Specifically, the circuit diagram shown in FIG. 21 is a part of a circuit diagram of the GaAs-HBT power amplifier bias circuit of the twelfth embodiment, and illustrates the idle current control circuit 10 which uses the collector voltage Vc2 of the amplifier transistor. In FIG. 21, symbols Rx22 to Rx27 denote resistances, and Fx3 and Fx4 denote FETs.

The power amplifier bias circuit of the twelfth embodiment differs from that of the sixth embodiment in that the first control section resistance Rx1 and the second control section resistance Rx2 are each made up of a plurality of resistances and an FET. Specifically, the first control section resistance Rx1 is made up of a series connection of resistances R22 and R23 and an FET Fx3 connected in parallel with R22. The second control section resistance Rx2, on the other hand, is made up of a series connection of resistances Rx24 and Rx25 and an FET Fx4 connected in parallel with Rx24.

Figure 22:
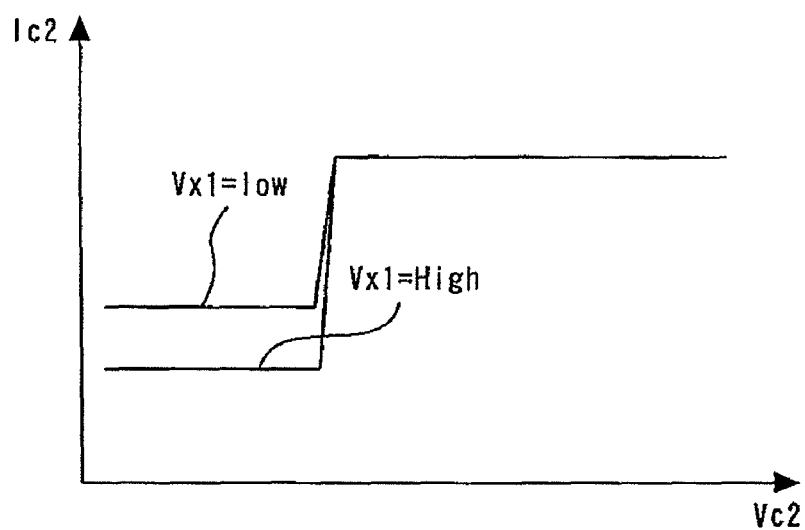
FIG. 22 is a schematic diagram illustrating the idle current of an amplifier transistor when the transistor is driven by the GaAs-HBT power amplifier bias circuit of the twelfth embodiment.

FIG. 22 is a schematic diagram illustrating the idle current of an amplifier transistor when the transistor is driven by the GaAs-HBT power amplifier bias circuit of the twelfth embodiment. According to the twelfth embodiment, Fx3 and Fx4 can be turned on or off depending on the voltage on Vx1. This means that it is possible to change the resistance value of the resistance Rx1 (made up of R22, R23, and Fx3) and the resistance value of the resistance Rx2 (made up of Rx24, Rx25, and Fx4). As a result, the idle current, when Vc2 is low, can be changed by changing the voltage on Vx1.

Thirteenth Embodiment

Figure 23:
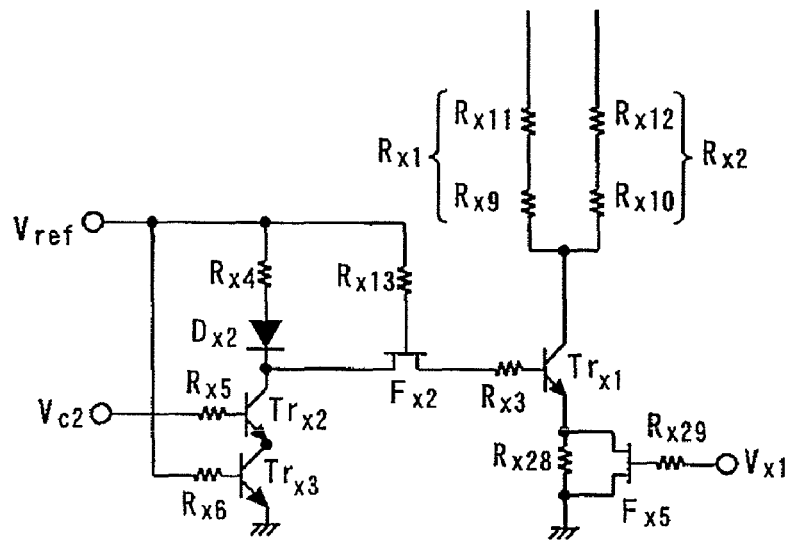
FIG. 23 is a circuit diagram showing the idle current control circuit of a GaAs-HBT power amplifier bias circuit according to a thirteenth embodiment of the present invention.

FIG. 23 is a circuit diagram showing the idle current control circuit of a GaAs-HBT power amplifier bias circuit according to a thirteenth embodiment of the present invention. Specifically, the circuit diagram shown in FIG. 23 is a part of a circuit diagram of the GaAs-HBT power amplifier bias circuit of the thirteenth embodiment, and illustrates the idle current control circuit 10 which uses the collector voltage Vc2 of the amplifier transistor. In FIG. 23, symbols Rx28 and Rx29 denote resistances, and Fx5 denotes an FET. The power amplifier bias circuit of the thirteenth embodiment differs from that of the sixth embodiment in that it additionally includes a circuit made up of Rx28, Fx5, and Rx29 connected to the emitter side of Trx1, which characterizes the thirteenth embodiment.

Specifically, the idle current control circuit 10 of the thirteenth embodiment includes a sixth control section resistance Rx28 (hereinafter referred to simply as Rx28) and a third switching field effect transistor Fx5 (hereinafter referred to simply as Fx5). One end of Rx28 is connected to the emitter of Trx1, and the other end is grounded. The source of Fx5 is connected to one end of Rx28, the drain of Fx5 is connected to the other end of Rx28, and the base of Fx5 is connected to Vx1 through the resistance Rx29.

Figure 24:
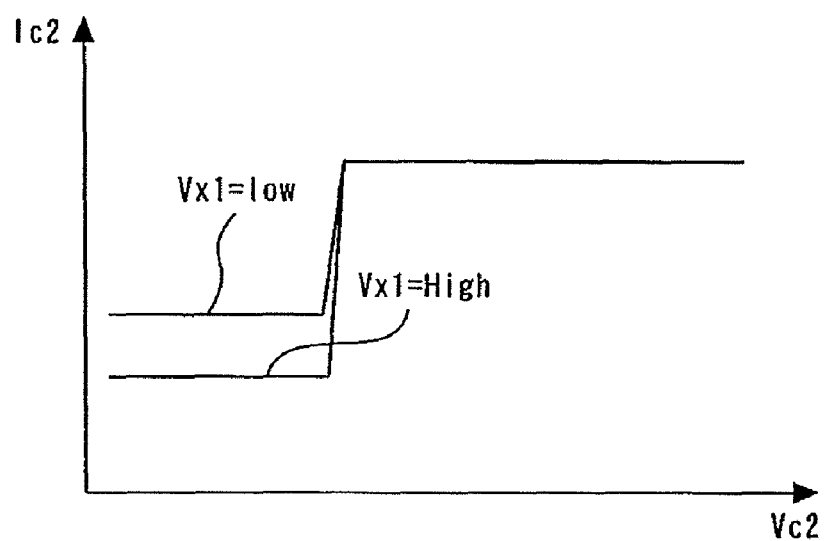
FIG. 24 is a schematic diagram illustrating the idle current of an amplifier transistor when the transistor is driven by the GaAs-HBT power amplifier bias circuit of the thirteenth embodiment.

FIG. 24 is a schematic diagram illustrating the idle current of an amplifier transistor when the transistor is driven by the GaAs-HBT power amplifier bias circuit of the thirteenth embodiment. In the idle current control circuit of the thirteenth embodiment, since Fx5 is turned on or off depending on the voltage on Vx1, it is possible to change the resistance values corresponding to the resistances Rx1 and Rx2 of the first embodiment. Therefore, the idle current, when Vc2 is low, can be changed by changing the voltage on Vx1.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2009-174475, filed on Jul. 27, 2009 including specification, claims, drawings and summary, on which the Convention priority of the present application is based, are incorporated herein by reference in its entirety.

The invention claimed is:

1. A power amplifier and bias circuit comprising:
    a first amplifier transistor having an emitter, a base, and a collector;
    a voltage drive bias circuit connected to said base of said first amplifier transistor;
    a current drive bias circuit connected in a parallel relationship with said voltage drive bias circuit and connected to said base of said first amplifier transistor;
    first and second resistances; and
    an idle current control circuit for controlling bias current input to said base of said first amplifier transistor in accordance with collector voltage of said first amplifier transistor, wherein
        said voltage drive bias circuit and said current drive bias circuit are connected to a reference voltage input terminal to which a reference voltage is externally applied,
        said voltage drive bias circuit includes:
            a first transistor having an emitter, a base, and a collector, supplying a bias current corresponding to the reference voltage to said base of said first amplifier transistor,
            a second transistor having a collector connected between said emitter of said first transistor and said base of said first amplifier transistor, through said first resistance, having a grounded emitter, and having a base, and
            a third transistor having a base connected to said reference voltage input terminal, through said second resistance, and supplying a bias current corresponding to the reference voltage to said base of said second transistor;
        said current drive bias circuit includes a third resistance connected at a first end to said reference voltage input terminal and at a second end to said base of said first amplifier transistor, and
        said idle current control circuit includes a first control section transistor having
            a collector connected between said base of said first amplifier transistor and parallel circuitry including said voltage drive bias circuit and said current drive bias circuit,
            having a base receiving a current corresponding to the collector voltage of said first amplifier transistor, and
            an emitter.

2. The power amplifier and bias circuit according to claim 1, wherein said idle current control circuit further includes a second control section transistor having
    a collector connected to said base of said first control section transistor,
    a base receiving a voltage corresponding to the collector voltage of said first amplifier transistor, and
    an emitter.

3. The power amplifier and bias circuit according to claim 2, wherein said idle current control circuit further includes a field effect transistor having
    a gate connected to said reference voltage input terminal and supplying a bias current corresponding to the reference voltage of said reference voltage input terminal to said base of said second control section transistor, and
    a source.

4. The power amplifier and bias circuit according to claim 3, wherein said idle current control circuit further includes a Schottky barrier diode having an anode connected to said source of said field effect transistor and having a cathode connected to said base of said second control section transistor.

5. The power amplifier and bias circuit according to claim 3, further comprising a shunt resistance connected to said source of said field effect transistor.

6. The power amplifier and bias circuit according to claim 1, further comprising:
    a second amplifier transistor having an emitter, a base, and a collector and connected in a parallel relationship with said first amplifier transistor; and
    a second amplifying device-side resistance connected between said reference voltage input terminal and said base of said second amplifier transistor, wherein
        a current is supplied from said reference voltage input terminal to said base of said second amplifier transistor through said second amplifying device-side resistance,
        when base voltage of said second amplifier transistor is equal to or higher than a threshold voltage for turning on said second amplifier transistor, said second amplifier transistor is turned on, and said idle current control circuit further includes:
- a first control section resistance connected at a first end to said collector of said first control section transistor and at a second end between said base of said first amplifier transistor and parallel circuitry including said voltage drive bias circuit and said current drive bias circuit, and
- a second control section resistance connected at a first end to said collector of said first control section transistor and at a second end between said second amplifying device-side resistance and said base of said second amplifier transistor.

7. The power amplifier and bias circuit according to claim 6, wherein at least one of said first control section resistance and said second control section resistance is a series connection of a thin film metal resistance and an epi-resistance, the thin film metal resistance being connected at a first end to said collector of said first control section transistor and at a second end to said base of said first amplifier transistor, the epi-resistance being a resistance component of a semiconductor layer of said first amplifier transistor or said second amplifier transistor.

8. The power amplifier and bias circuit according to claim 2, wherein said idle current control circuit further includes a field effect transistor having a gate connected to said reference voltage input terminal and having a source and a drain through which said base of said first control section transistor is connected to said collector of said second control section transistor.

9. The power amplifier and bias circuit according to claim 2, wherein said idle current control circuit further includes:
- a third control section transistor having a collector connected to said emitter of said second control section transistor and having a base connected to said reference voltage input terminal; and
- a control section resistance connected at a first end to said emitter of said second control section transistor and at a second end to said collector of said third control section transistor.

10. The power amplifier and bias circuit according to claim 2, wherein said idle current control circuit further includes:
- a third control section transistor having a collector and a base which are connected to said reference voltage input terminal and which are connected to said base of said second control section transistor; and
- a control section resistance connected at a first end to said collector and said base of said third control section transistor and at a second end to said reference voltage input terminal.

11. The power amplifier and bias circuit according to claim 2, wherein said idle current control circuit further includes:
- a control section resistance connected in series between said collector of said second control section transistor and said base of said first control section transistor; and
- a third control section transistor having a collector and a base which are connected between said control section resistance and said base of said first control section transistor.

12. The power amplifier and bias circuit according to claim 2, wherein:
said idle current control circuit further includes a parallel circuit connected between a first junction and a second junction such that said parallel circuit is connected in a parallel relationship with said first control section transistor, said first junction being between said base of said first amplifier transistor and parallel circuitry including said voltage drive bias circuit and said current drive bias circuit, said second junction being between said base of said first control section transistor and said collector of said second control section transistor; and said parallel circuit includes:
- at least one parallel connection control section transistor having a collector connected to said first junction and having a base connected to said second junction, and
- a switching device connected between said base of said at least one parallel connection control section transistor and said second junction and electrically connecting said base of said at least one parallel connection control transistor to and disconnecting said base of said at least one parallel connection control transistor from said second junction in response to an external signal.

13. The power amplifier bias circuit according to claim 1, wherein said idle current control circuit includes:
- a second control section transistor having a collector connected to said base of said first control section transistor and having a base receiving a voltage corresponding to the collector voltage of said first amplifier transistor;
- a control section field effect transistor having a source and a drain through which said base of said first control section transistor is connected to said collector of said second control section transistor;
- a parallel circuit connected between a first junction and a second junction such that said parallel circuit is connected in a parallel relationship with said first control section transistor, said first junction being between said base of said first amplifier transistor and parallel circuitry including said voltage drive bias circuit and said current drive bias circuit, said second junction being between said base of said first control section transistor and said collector of said second control section transistor, wherein
  said parallel circuit includes at least one parallel connection control section transistor having a collector connected to said first junction and having a base connected to said second junction, and
  said parallel circuit further includes a switching field effect transistor having a source, a gate, and a drain, and connected between said base of said at least one parallel connection control section transistor and said second junction, said switching field effect transistor electrically connecting said base of said at least one parallel connection control transistor to and disconnecting said base of said at least one parallel connection control transistor from said second junction in response to the voltage input to the gate of said switching field effect transistor;
- a signal input terminal receiving an external voltage signal;
- a first switching voltage generation transistor having a base connected to said signal input terminal and having a collector connected to said reference voltage input terminal and said gate of said control section field effect transistor;
- a second switching voltage generation transistor having a collector connected to said reference voltage input terminal and said gate of said switching field effect transistor, and a base; and
- a third switching voltage generation transistor having a base connected to said signal input terminal and having a collector connected to said reference voltage input terminal and said base of said second switching voltage generation transistor.

14. The power amplifier and bias circuit according to claim 6, wherein:
said first control section resistance is a series connection of a plurality of resistances and includes a first resistance group connected at first ends to said collector of said first control section transistor and at second ends between said base of said first amplifier transistor and parallel circuitry including said voltage drive bias circuit and said current drive bias circuit;
said second control section resistance is a series connection of a plurality of resistances and includes a second resistance group connected at first ends to said collector of said first control section transistor and at second ends between said second amplifying device-side resistance and said base of said second amplifier transistor; and
said power amplifier and bias circuit further comprises:
a first switching field effect transistor having a source connected to said first ends of said first resistance group and having a drain connected to said second ends of said first resistance group; and
a second switching field effect transistor having a source connected to said first ends of said second resistance group and having a drain connected to said second ends of said second resistance group.

15. The power amplifier and bias circuit according to claim 1, wherein said idle current control circuit further includes:
a control section resistance connected at a first end to said emitter of said first control section transistor and grounded at a second end; and
a switching field effect transistor having a source connected to a second end of said control section resistance and having a drain connected to a second end of said control section resistance.

* * * * *